United States Patent
Yoo

(10) Patent No.: US 6,448,814 B1
(45) Date of Patent: Sep. 10, 2002

(54) CMOS BUFFER CIRCUIT

(75) Inventor: Chang-sik Yoo, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/878,942

(22) Filed: Jun. 13, 2001

(30) Foreign Application Priority Data

Sep. 21, 2000 (KR) ........................................ 2000-55482

(51) Int. Cl.$^7$ ............................................. H03K 17/16
(52) U.S. Cl. ...................... 326/83; 326/86; 326/112; 326/119; 326/121
(58) Field of Search ................................ 326/83, 81, 86, 326/87, 112, 119, 121

(56) References Cited

U.S. PATENT DOCUMENTS

| | | | | |
|---|---|---|---|---|
| 5,329,175 A | * | 7/1994 | Peterson | ...................... 307/443 |
| 5,656,960 A | * | 8/1997 | Holzer | ........................ 327/170 |
| 5,672,983 A | * | 9/1997 | Yamamoto et al. | ........... 326/27 |
| 6,169,421 B1 | * | 1/2001 | Bryan et al. | ................... 326/83 |

* cited by examiner

Primary Examiner—Michael Tokar
Assistant Examiner—Vibol Tan
(74) Attorney, Agent, or Firm—Lee & Sterba, P.C.

(57) ABSTRACT

A CMOS buffer circuit for preventing a short circuit current of an output buffer transistor that drives a load including a pre-driving stage, formed of even-numbered inverters connected in series, and the respective inverters are preferably designed to exponentially increase the driving capability; an output buffer driving stage, including a pull-up PMOS driving stage, which outputs a first signal, in response to an output signal of the pre-driving stage and an output signal of the pull-down NMOS driving stage and a pull-down NMOS driving stage, which outputs a second signal, in response to an output signal of the pre-driving stage and an output signal of the pull-up PMOS driving stage; and an output stage, an inverter formed of the pull-up PMOS transistor driven by the first signal and a pull-down NMOS transistor driven by the second signal, which drives a load connected to an output of the inverter.

8 Claims, 3 Drawing Sheets

CMOS BUFFER CIRCUIT

BACKGROUND OF THE INVENTION

1. Field of the Invention

The present invention relates to a semiconductor integrated circuit. More particularly, the present invention relates to a complementary metal oxide silicon (CMOS) buffer circuit.

2. Description of the Related Art

CMOS buffer circuits are mainly used for driving devices connected to an output stage thereof, particularly, devices having capacitance. If a signal bus in a memory has to drive a large load, or a clock signal has to drive a large load within a chip in a circuit only formed of logic devices, buffer circuits are needed for the bus signal and the clock signal.

In the case of CMOS very large scale integration (CMOS VLSI), as the integration density increases, capacitance load on the clock signal becomes larger, and particularly in the case of a data output buffer, a load capacitor located outside the chip must be driven. However, the power consumption of the buffer circuit for the bus signal or the clock signal to drive a large load capacitance takes a very large part of entire power consumption of the chip.

Generally, the power consumption of the CMOS circuit can be divided into dynamic power consumption and short circuit power consumption. The dynamic power consumption is inevitable due to the electric characteristics of the CMOS buffer circuit, but the short circuit power consumption results in unnecessarily wasted power. Accordingly, it is preferable to eliminate the short circuit power consumption.

FIG. 1 illustrates a circuit diagram showing a conventional CMOS buffer circuit, and FIG. 2 illustrates a waveform diagram of signals in the conventional buffer circuit illustrated in FIG. 1 when it is being driven.

Referring to FIG. 1, the conventional CMOS buffer circuit includes a plurality of inverters connected in series, and each of the inverters sequentially increases the output driving ability, so that the inverters are designed to finally drive a large capacitance.

However, in the conventional CMOS buffer circuit illustrated in FIG. 1, there is a regular time interval, in which a PMOS transistor (M11) and an NMOS transistor (M12) turn on at the same time due to a gradual voltage slope with respect to time of a signal N1 for driving two transistors (M11 and M12). The voltage slope of the signal becomes more gradual as the driven load becomes larger, so that the interval in which the two transistors turn on at the same time becomes longer. During this interval, a short circuit current flows through both the PMOS transistor (M11) and the NMOS transistor (M12). The size of two transistors (M11 and M12) is generally very large. Thus, the short circuit current corresponding to the two transistors is considerably large.

Referring to FIG. 2, a time interval $t_1$ and a time interval $t_2$ are intervals in which the two transistors (M11 and M12) are on at the same time, and show that a considerable current flows depending on the size of the two transistors (M11 and M12). In the time interval $t_1$, in which a signal N1 is in transition from a high "H" state to a low "L" state, a regular current unnecessarily flows in the NMOS transistor (M12). In the same way, in the time interval $t_2$, in which the signal N1 is in transition from the "L" state to the "H" state, an unnecessary current flows in the PMOS transistor (M11).

SUMMARY OF THE INVENTION

To solve the above problems, it is a feature of an embodiment of the present invention to provide a CMOS buffer circuit for preventing unnecessary short circuit current.

Accordingly, to provide the above feature, there is provided a CMOS buffer circuit including a pre-driving stage, an output buffer driving stage, and an output stage.

The pre-driving stage is formed of an even number of inverters, and each of the inverters is preferably designed to make the output driving capability of input signals increase exponentially.

The output buffer driving stage includes a pull-up PMOS driving stage and a pull-down NMOS driving stage. The pull-up PMOS driving stage drives a pull-up PMOS transistor of the output stage, and the pull-down NMOS driving stage drives a pull-down NMOS transistor of the output stage. Since the output signals of the pull-up PMOS driving stage and pull-down NMOS driving stage have the same frequency, and the duty cycle of the pulses are differently devised, an interval in which the pull-up PMOS transistor and pull-down NMOS transistor of the output stage turn on at the same time is prevented.

The output stage is an inverter formed of the pull-up PMOS transistor and pull-down NMOS transistor, and drives a load connected to the output of the inverter.

These and other features of the present invention will be readily apparent to those of ordinary skill in the art upon review of the detailed description that follows.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE PREFERRED EMBODIMENTS

Figure 1:
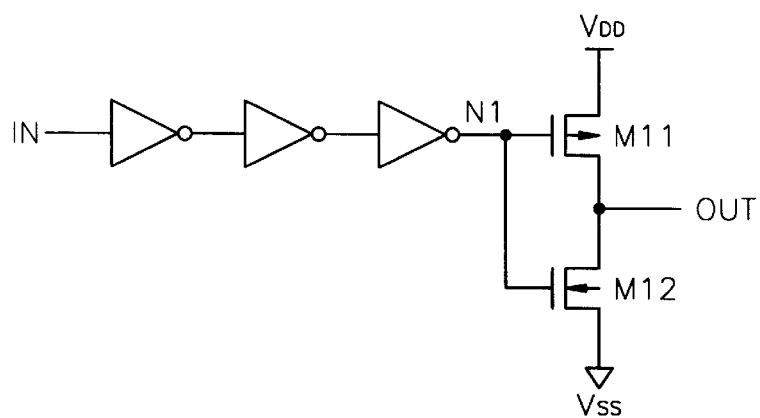
FIG. 1 illustrates a circuit diagram showing an example of a conventional CMOS buffer circuit according to the prior art.
Figure 2:
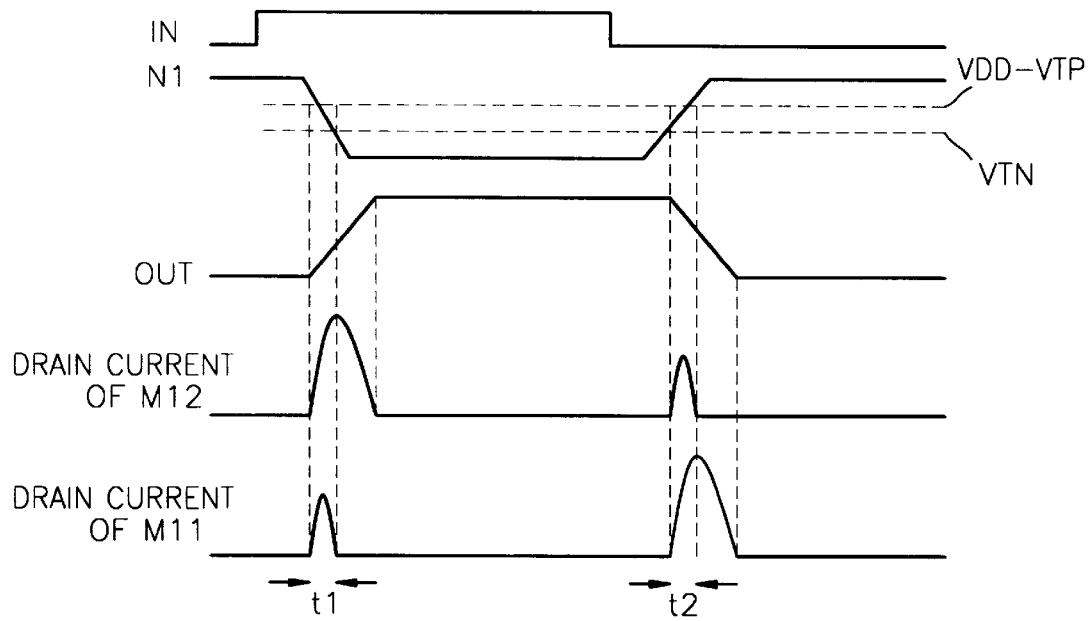
FIG. 2 illustrates a waveform diagram of signals of the conventional CMOS buffer circuit illustrated in FIG. 1 according to the prior art.

Korean Patent Application No. 00-55482, filed Sep. 21, 2000, and entitled, "CMOS Buffer Circuit," is incorporated herein by reference in its entirety.

A preferred embodiment of the present invention will be described in greater detail with reference to the appended drawings, wherein like reference numerals in different drawings indicate like members.

Figure 3:
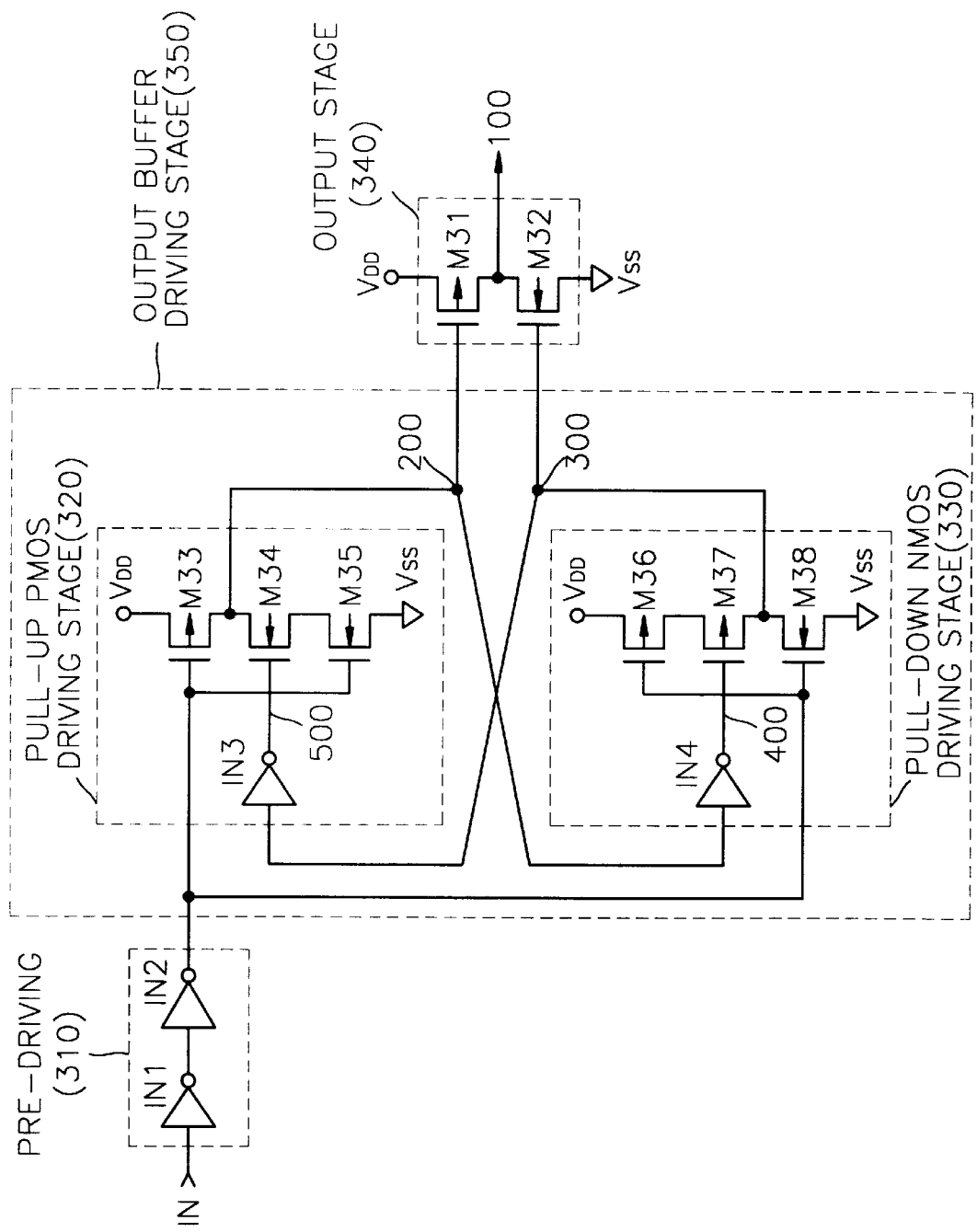
FIG. 3 illustrates a circuit diagram of a CMOS buffer circuit according to a preferred embodiment of the present invention.

Referring to FIG. 3, the CMOS buffer circuit according to a preferred embodiment of the present invention includes a pre-driving stage 310, an output buffer driving stage 350, and an output stage 340.

The pre-driving stage 310 is comprised of two inverters IN1 and IN2 in series. Preferably, the driving capability of the inverter IN2 connected to the output of the inverter IN1 is designed to increase exponentially with respect to the inverter IN1, which receives an external signal IN.

The output buffer driving stage 350 includes a pull-up PMOS driving stage 320 for controlling the gate voltage of a pull-up PMOS transistor (M31) of the output stage 340, and a pull-down NMOS driving stage 330 for controlling the gate voltage of a pull-down NMOS transistor (M32) of the output stage 340.

The pull-up PMOS driving stage 320 includes three MOS transistors (M33, M34, and M35), and an inverter IN3. One end of a MOS transistor (M33), which is a PMOS transistor, is connected to a high source voltage ($V_{DD}$), the other end is connected to an output 200, and an output signal of the pre-driving stage 310 is applied to the gate of MOS transistor (M33). One end of a MOS transistor (M34), which is an NMOS transistor, is connected to the output terminal 200, the other end is connected to the NMOS transistor (M35), and an output signal of the inverter IN3, that is a third signal 500, is applied to the gate of MOS transistor (M34). One end of the MOS transistor (M35), which is an NMOS transistor, is connected to the NMOS transistor (M34), the other end is connected to a low source voltage ($V_{SS}$), and an output signal of the pre-driving stage 310 is applied to the gate of MOS transistor (M35). The inverter IN3 receives an output signal of the pull-down NMOS driving stage 330, that is a second signal 300, and produces an output signal, that is the third signal 500.

The pull-down NMOS driving stage 330 includes three MOS transistors (M36, M37, and M38), and an inverter IN4. One end of MOS transistor (M36), which is a PMOS transistor, is connected to the high source voltage ($V_{DD}$), the other end is connected to the PMOS transistor 37, and an output signal of the pre-driving stage 310 is applied to the gate; one end of MOS transistor (M37), which is a PMOS transistor, is connected to the output 300 of the pull-down NMOS driving stage 330, the other end is connected to the PMOS transistor (M36), and an output signal of the inverter IN4, that is a fourth signal 400, is applied to the gate; and one end of MOS transistor (M38), which is NMOS transistor, is connected to the output 300 of the pull-down NMOS driving stage 330, the other end is connected to the source voltage ($V_{SS}$), and an output signal of the pre-driving stage 310 is applied to the gate. The inverter IN4 produces an output signal, that is the fourth signal 400 by receiving an output signal of the pull-up PMOS driving stage 320, that is a first signal 200.

The output stage 340 is formed of a PMOS transistor (M31) and an NMOS transistor (M32). One end of the PMOS transistor (M31) is connected to the high source voltage ($V_{DD}$), the other end is connected to an output terminal 100, and an output signal of the pull-up PMOS driving stage 320, that is the first signal 200, is applied to the gate. One end of the NMOS transistor (M32) is connected to the low source voltage ($V_{SS}$), the other end is connected to the output terminal 100, and an output signal of the pull-down NMOS driving stage 330, that is the second signal 300, is applied to the gate.

Hereinafter, according to a preferred embodiment of the present invention, the operation of the CMOS buffer circuit will be described in greater detail with reference to FIG. 3.

If an input signal (IN) is in an "L" state, a specified time passes, and the output terminal 100 maintains the "L" state. In this state, if the input signal (IN) is transited to the "H" state, the transistors (M35 and M38) turn on, and the second signal 300 is transited to the "L" state. Therefore, the NMOS transistor (M32) of the output stage 340 turns off, but the voltage of the output terminal 100 maintains the previous state due to the electrical characteristics of the load capacitance. However, the first signal 200 is transited to the "L" state after the inverting delay time of the fed-back second output signal 300 and the turn-on delay time of the NMOS transistor (M34). Here, finally the PMOS transistor (M31) of the output stage 340 turns on, so that the voltage of the output terminal 100 becomes "H." In other words, after the second signal 300 is transited to the "L" state, and a specified time passes, the first signal 200 is transited to the "L" state. Therefore, if the input signal (IN) is transited from the "L" state to the "H" state, the two transistors (M31 and M32) of the output stage do not turn on at the same time.

The case where the input signal (IN) is transited from the "H" state to the "L" state will now be examined. If the input signal (IN) is in "H" state, a specified time passes, and the output terminal 100 becomes the "H" state. Here, if the input signal (IN) is transited to the "L" state, the PMOS transistors (M33 and M36) turn on, so that first signal 200 is transited to the "H" state. Accordingly, the PMOS transistor (M31) of the output stage 340 turns off, but the voltage of the output terminal 100 maintains the previous state, the "H" state, due to the electrical characteristics of the load capacitance. However, the second signal 300 is transited to the "H" state after the inverting delay time of the fed-back first signal 200 and the turn-on delay time of the NMOS transistor (M37). Here, finally the NMOS transistor M32 of the output stage 340 turns on, so that the voltage of the output terminal 100 becomes the "L" state. In other words, after the first signal 200 is transited to the "H" state, and a specified time passes, the second signal 300 becomes the "H" state. Therefore, if the input signal (IN) is transited from the "H" state to the "L" state, the two transistors (M31 and M32) of the output stage 340 do not turn on at the same time, so that a short circuit current is not generated.

Figure 4:
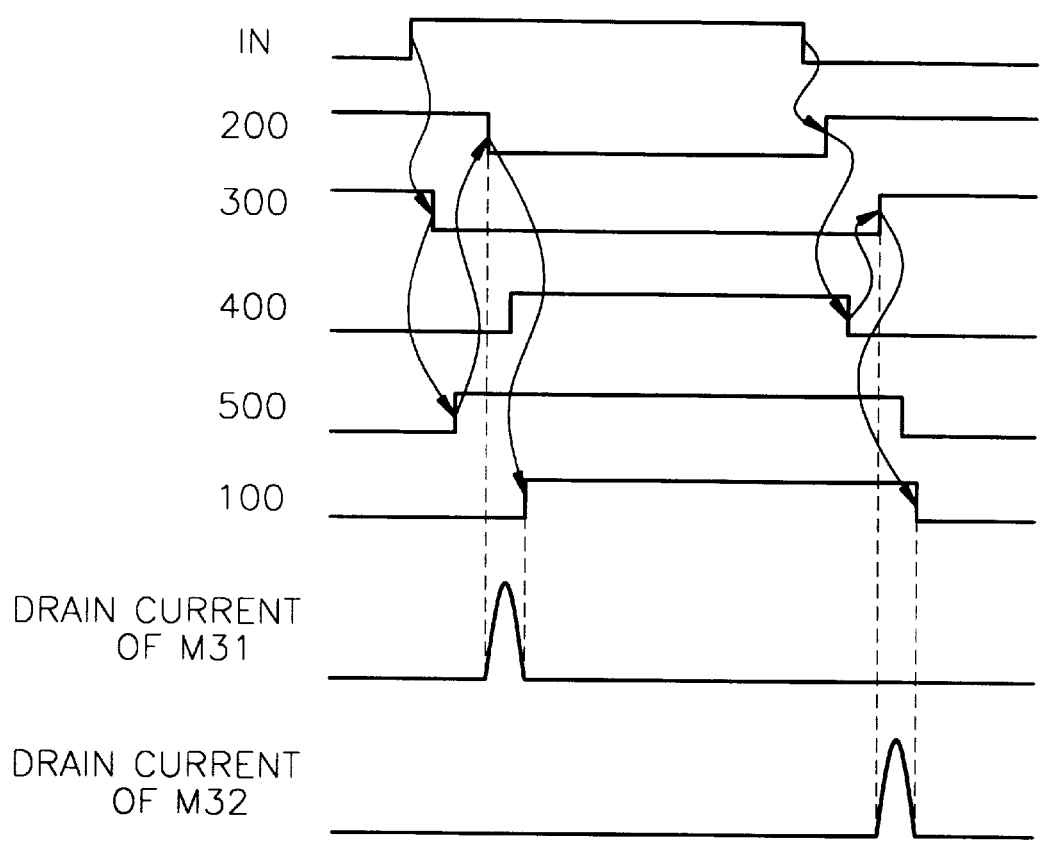
FIG. 4 illustrates a waveform diagram for explaining the operation of the circuit illustrated in FIG. 3 according to a preferred embodiment of the present invention.

FIG. 4 shows a signal transition timing diagram in which transitions are indicated with arrows.

First, if the input signal (IN) is transited from the "L" state to the "H" state, the second signal 300 is transited to the "L" state, and sequentially the output node 500 of the inverter IN3 is transited to the "H" state, the first signal 200 is transited to the "L" state, the output node 400 of the inverter IN4 is transited to the "H" state, and finally due to the "L" state of the first signal 200, the output terminal 100 is transited to the "H" state. Here, because the output signal 400 of the inverter IN4 does not have a direct influence on the voltage of the output node 100, it is not shown by the arrows illustrating the signal flow. Therefore, the gate signal of the pull-up PMOS transistor (M31), the first signal 200, is not transited to the "L" state until the gate signal of the pull-down NMOS transistor (M32), the second signal 300, is transited to the "L" state, so that the two transistors (M31 and M32) do not turn on at the same time.

Second, if the input signal (IN) is transited from the "H" state to the "L" state, the first signal 200 is first transited to the "H" state, and sequentially the output node 400 of the inverter IN4 to the "L" state, the second signal 300 is transited to the "H" state, the output node 500 of the inverter IN3 is transited to the "L" state, and finally due to the "H" state of the second signal 300, the output terminal 100 is transited to the "L" state. Here, because the output signal 500 of the inverter IN3 does not have a direct influence on the voltage of the output node 100, it is not shown by the arrows illustrating the signal flow. Therefore, the gate signal of the pull-down NMOS transistor (M32), the third output signal 300 is not transited to the "H" state until the gate signal of the pull-up PMOS transistor (M31), the second output voltage 200 is transited to the "H" state, so that the two transistors (M31 and M32) do not turn on at the same time, and there is no consumption of the short circuit current thereby.

As described, the CMOS buffer circuit according to the present invention has an advantage in that the power consumption of the short circuit can be prevented.

The present invention has been described with reference to a preferred embodiment illustrated in the drawings; however, this is only one example, and various changes and other embodiments of the present invention may be made by one of ordinary skill in the art without departing from the spirit and scope of the invention as defined by the appended claims.

What is claimed is:

1. A CMOS buffer circuit comprising:

a pre-driving stage for receiving an input signal and sequentially increasing an output driving capability of the input signal;

an output buffer driving stage for producing first and second signals having the same frequency and a different pulse duty cycle, responding to an output signal of the pre-driving stage, wherein the output buffer driving stage includes:

a pull-up PMOS driving stage for outputting the first signal which drives the output stage, responding to the output signal of the pre-driving stage and the second signal; and a pull-down NMOS driving stage for outputting the second signal which drives the output stage, responding to the output signal of the pre-driving stage and the first signal; and an output stage for driving an output terminal, responding to the first and second signals of the output buffer driving stage.

2. The CMOS buffer circuit of claim 1, wherein the output stage includes:

a first MOS transistor for providing a pull-up current to the output terminal, the first MOS transistor having a first end connected to a high source voltage, a second end connected to the output terminal, and a gate to which the first signal is applied; and a second MOS transistor for pulling down a current from the output terminal, the second MOS transistor having a first end connected to a low source voltage, a second end connected to the output terminal, and a gate to which the second signal is applied.

3. The CMOS buffer circuit of claim 1, wherein the pull-up PMOS driving stage includes:

a first inverter for producing a third signal, responding to the second signal;

a third MOS transistor with a first end connected to a high source voltage, a second end connected to the output terminal of the pull-up PMOS driving stage, and a gate to which the output signal of the pre-driving stage is applied;

a fourth MOS transistor with a first end connected to the output terminal of the pull-up PMOS driving stage, a second end, and a gate to which the third signal is applied; and a fifth MOS transistor with a first end connected to the second end of the fourth MOS transistor, a second other end connected to the low source voltage, and a gate to which the output signal of the pre-driving stage is applied.

4. The CMOS buffer circuit of claim 1, wherein the pull-down NMOS driving stage includes:

a second inverter for producing a fourth signal, responding to the first signal;

a sixth MOS transistor with a first end connected to the high source voltage, a second end, and a gate to which the output signal of the pre-driving stage is applied;

a seventh MOS transistor with a first end connected to the second end of the sixth MOS transistor, a second end connected to the output terminal of the pull-down NMOS driving stage, and a gate to which the fourth signal is applied; and an eighth MOS transistor with a first end connected to the output terminal of the pull-down NMOS driving stage, a second end connected to the low source voltage, and a gate to which the output signal of the pre-driving stage is applied.

5. The CMOS buffer circuit of claim 1, wherein a short circuit current does not flow during an input signal transition from the "L" state to the "H" state and also during an input signal transition from the "H" state to the "L" state.

6. The CMOS buffer circuit of claim 2, wherein the first MOS transistor is a p-type transistor, and the second MOS transistor is an n-type transistor.

7. The CMOS buffer circuit of claim 3, wherein the third MOS transistor is a p-type transistor, and the fourth and fifth MOS transistors are n-type transistors.

8. The CMOS buffer circuit of claim 4, wherein the sixth and seventh MOS transistors are p-type transistors and the eighth MOS transistor is an n-type transistor.

* * * * *